United States Patent [19]

Maltsev

[11] Patent Number: 5,761,219
[45] Date of Patent: Jun. 2, 1998

[54] ERROR CORRECTION FOR PDF417 AND OTHER MACHINE-READABLE SYMBOLOGIES

[75] Inventor: Pavel A. Maltsev, Everett, Wash.

[73] Assignee: Intermec Technologies Corporation, Everett, Wash.

[21] Appl. No.: 679,657

[22] Filed: Jul. 12, 1996

[51] Int. Cl.[6] ............................. H03M 13/00; G06K 5/00
[52] U.S. Cl. ...................... 371/37.01; 235/437; 235/462; 371/37.11
[58] Field of Search .................................. 235/437, 462; 371/37.01, 37.11

[56] References Cited

U.S. PATENT DOCUMENTS

| | | | |
|---|---|---|---|
| 4,998,010 | 3/1991 | Chandler et al. | 235/494 |
| 5,262,623 | 11/1993 | Batterman et al. | 235/454 |
| 5,637,849 | 6/1997 | Wang et al. | 235/454 |
| 5,675,136 | 10/1997 | Keinath et al. | 235/462 |

OTHER PUBLICATIONS

*AIM Uniform Symbology Specification: PDF417*. AIM USA, 1994.

Blahut, Richard E. Sections 7.3–7.5, 9.1–9.2, and 11.3, pp. 174–191, 249–260, and 317–323, *Theory and Practice of Error Control Codes*, Addison–Wesley Publishing Co., 1984.

Gonzalez, Rafael C. and Wintz, Paul Chapter 3: Image Transforms, sections 3.1–3.2, pp. 36–47, *Digital Image Processing*, Addison–Wesley Publishing Co., 1977.

Lin, Shu and Costello, Daniel J., Jr. Chapter 6: BCH Codes, pp. 141–183, *Error Control Coding: Fundamental and Applications*, Prentice–Hall, 1983.

Sorensen, Henrik V. and Burrus, C. Sidney Section 8–2, pp. 517–553, *Handbook for Digital Signal Processing*, Mitra and Kaiser, eds, Wiley, 1994.

Pollard, J.M. "The Fast Fourier Transform in a Finite Field," *Mathematics of Computation* 25(114): 365–374, 1971.

Tanenbaum, Andrew S. Chapter 3: The Physical Layer, pp. 91–132, *Computer Networks*, Prentice–Hall, 1981.

*Primary Examiner*—Stephen M. Baker
*Attorney, Agent, or Firm*—Seed and Berry LLP

[57] ABSTRACT

A method and apparatus is described which provides improved error correction for reading a PDF417 or other machine-readable symbol having a data region with symbol characters representing encoded data. A processor receives the encoded data read from the PDF417 symbol and executes an error correction routine. The error correction routine includes a two dimensional discrete Fourier transform with a reduced number of arithmetic operations. The transform is a variant of the Good-Thomas FFT performed over the Galois field GF(929), and includes a set of first index values $i_1$ (consisting of all integers from 0 to 28 inclusive) and a second set of index values $i_2$ (consisting of all integers from 0 to 31 inclusive). For a given first index value, the transform is performed only over a subset of the second index values. The subset of second index values is the first k values of a sequence given by $i_1+29*r$, where r=0, 1, 2, . . . , 31, and k is the minimum of values 31 and [b/29]+1. The value b is the number of symbol characters in the data region of the PDF417, and [b/29] is the least integer function of the quotient b/29. It is particularly advantageous to collect in a single table each of the sequences corresponding to a particular value of $i_1$.

21 Claims, 5 Drawing Sheets

ERROR CORRECTION FOR PDF417 AND OTHER MACHINE-READABLE SYMBOLOGIES

TECHNICAL FIELD

The present invention relates to a method and apparatus for reading machine-readable symbols, and more particularly, to a method and apparatus for reading symbols requiring error correction.

BACKGROUND OF THE INVENTION

Large volumes of information are communicated and stored in the form of digital data. Much of this data is very sensitive to errors. Using error-control codes is a well-known digital signal processing technique which protects digital data against errors that may occur during transmission and/or storage. Given data values $d_0$–$d_{n-1}$, encoding circuits or algorithms are employed to generate error correction values $c_0$–$c_k$. Concatenation of the data $d_0$–$d_{n-1}$ and the error correction values $c_0$–$c_k$ then produces originally encoded data $d_0$–$d_{n-1}$,$c_0$–$c_k$ with sufficient informational redundancy to correct a number of errors which may arise during the transmission and/or storage of the encoded data.

Upon receipt/retrieval of encoded data $d_0'$–$d_{n-1}'$,$c_0'$–$c_{k-1}'$, decoding circuits or algorithms are employed to reconstruct the data $d_0$–$d_{n-1}$. The received encoded data $d_0'$–$d_{n-1}'$, $c_0'$–$c_{k-1}'$ may well include a number of transmission/storage-induced errors relative to the originally encoded data $d_0$–$d_{n-1}$, $c_0$–$c_{k-1}$. Typically, error correction magnitudes $e_0$–$e_{p-1}$ are generated from and combined with the received encoded data $d_0'$–$d_{n-1}'$, $c_0'$–$c_{k-1}'$ to produce the error corrected data $d_0$–$d_{n-1}$.

For relatively simple error-control codes, encoding and decoding the codes can be implemented with electric hardware circuitry. However, for more complex error-control codes having robust error correction capability, the codes are typically manipulated by processors executing software routines.

One well-known way of storing information is with bar code symbologies. The first bar code symbologies developed, such as UPC, Code 39, Interleaved 2 of 5, and Code 93, are "linear symbologies," in that a given symbol is decoded along one axis or direction. Data is stored in the form of "symbol characters," which are generally parallel arrangements of alternating, variable width strips of lower reflectivity ("bars") and higher reflectivity ("spaces"). A unique pattern of bars and spaces corresponds with a particular symbol character, and thus with a particular data value.

The use of bar code symbologies has increased, and so too the desire to store greater amounts of data within a smaller area. To increase the density of stored data, "multi-row" or "stacked" symbologies have been developed, such as Code 49 and PDF417. Stacked symbologies generally employ several adjacent rows of variable width bars and spaces.

Unfortunately, errors often occur when employing bar code symbologies for information storage. Errors can be caused by poor print quality in a symbol, poorly-designed or employed symbol reading equipment, etc. Portions of a symbol might have insufficient contrast, be partially obliterated, include random spots or voids, or fall outside a symbol reader's field of view. Such errors are increasingly likely with the ever-increasing density of stored data in bar code symbologies.

FIG. 1 shows a typical PDF417 symbol 30 and its structure. Every PDF417 symbol contains a minimum of three to a maximum of ninety rows 32 (six are shown). Each row 32 includes a leading quiet zone 34, a start pattern 36, a left row indicator symbol character 38, a data region 40 having one to thirty encoded data symbol characters 41 (two are shown), a right row indicator symbol character 42, a stop pattern 44, and a trailing quiet zone 46. Every PDF417 symbol 30 also includes a quiet zone 48 located above and below the first and last rows 32, respectively. Each symbol character is formed from four bars and four spaces. Each bar or space is of width one to six "modules" (one module being the smallest unit width), subject to the constraint that each symbol character has a total width of seventeen modules. Each symbol character represents a numerical value in the range of 0 to 928, and the number of encoded data symbol characters 41 in the data region 40 cannot exceed 928.

In order to minimize errors associated with scanning symbol characters from adjacent rows, the entire set of PDF417 symbol characters is divided into three mutually exclusive sets or "clusters." Each cluster encodes all of the PDF417 symbol characters with distinct bar and space patterns. Within each cluster, each symbol character is associated with a unique value in the range of 0 to 928. The row indicators 38, 42 have values indicating the row number, the number of rows in the symbol 30, and the number of columns in the data region 40. The data region 40 includes symbol characters 41 representing both data values and error correction values.

PDF417 symbology employs error correction values which are generated using the well-known Reed-Solomon error-control code algorithm. See, for example, *Error Control Coding, Fundamentals and Applications*, by Shu Lin and D. J. Costello, Jr. (Prentice-Hall, 1983). Both rejection errors ("erasures") and substitution errors ("errors") are correctable. An erasure is a missing, unscanned or unreadable symbol character—the position of the symbol character being known, but not its value. An error is a misread or mislocated symbol character, and therefore both the position and value of the symbol character are unknown. PDF417 symbology also employs an error detection capability which interrupts symbol reading if the number of errors exceeds the error correction capacity.

FIG. 2 is a flowchart which depicts an error correction routine 50 used by prior art PDF417 symbology readers. Encoded data is received in step 52, along with the locations of any erasures. An erasure location polynomial and an encoded data polynomial are constructed from the encoded data in step 54. In step 56, a data spectrum polynomial is generated by performing a discrete Fourier transform over Galois field GF(929) of the encoded data polynomial. A convolution of the data spectrum polynomial and the erasure location polynomial is performed in step 58. An error location polynomial is calculated in step 60—typically in accordance with the well-known Berlekamp-Massey algorithm. See, for example, *Theory and Practice of Error Control Codes*, by Richard E. Blahut (Addison Wesley, 1983). In step 62, an error-erasure location polynomial is calculated by multiplying the error location polynomial with the erasure location polynomial. Error magnitudes are then calculated in step 64—typically in accordance with the well-known Forney algorithm. Finally, in step 66, corrected data is calculated by subtracting the previously calculated error magnitudes from the encoded data.

One of the most time consuming steps in the error correction/detection algorithm for PDF417 symbology is calculating the discrete Fourier transform over GF(929). Although efficient discrete Fourier transforms known as fast Fourier transforms (FFTs) have been developed to speed numerical processing, calculating the Fourier transform continues to be a time-costly step.

SUMMARY OF THE INVENTION

According to the present invention, a method is provided for reading a PDF417 symbol which stores encoded data. An error correction routine is performed which includes a two dimensional discrete Fourier transform having a reduced number of arithmetic operations. The transform is a variant of the Good-Thomas FFT performed over the Galois field GF(929), and includes a set of first index values $i_1$ (consisting of all integers from 0 to 28 inclusive) and a second set of index values $i_2$ (consisting of all integers from 0 to 31 inclusive). For a given first index value, the transform is performed only over a subset of the second index values. The subset of second index values is the first k values of a sequence given by $i_1+29*r$, where r=0, 1, 2, ...., 31, and k is the minimum of values 31 and $[b/29]+1$. The value b is the number of symbol characters in the data region of the PDF417, and $[b/29]$ represents the greatest integer less than or equal to the ratio $b/29$. It is particularly advantageous to collect in a single table each of the sequences corresponding to a particular value of $i_1$.

Also in accordance with the present invention, an apparatus is provided for reading a machine-readable symbol having a data region with symbol characters. The symbol characters include information symbol characters and error correction symbol characters. A sensor receives light reflected by the symbol and responsively produces an output signal. A converter receives this output signal and responsively produces a data signal indicative of at least some of the symbol characters. A processor receives the data signal and responsively produces an information signal which is indicative of the information symbol characters. The processor is programmed to perform an error correction routine which includes a discrete Fourier transform of the data signal. The Fourier transform includes a first dimension characterized by a set of first index values and a second dimension characterized by a set of second index values. The Fourier transform is performed over a subset of the second index values, with the subset being determined as a function of a given first index value and the number of symbol characters.

DETAILED DESCRIPTION OF THE PREFERRED EMBODIMENT

A method and apparatus is described for reading machine-readable symbols having error correction capability. In the following description, specific details are set forth, such as particular functional hardware components and software algorithms, in order to provide a thorough understanding of the presently preferred embodiment of the invention. However, one skilled in the art will appreciate that the invention may be practiced without these details. In other instances, certain details have been not been described in order to not unnecessarily obscure the invention.

Figure 1:
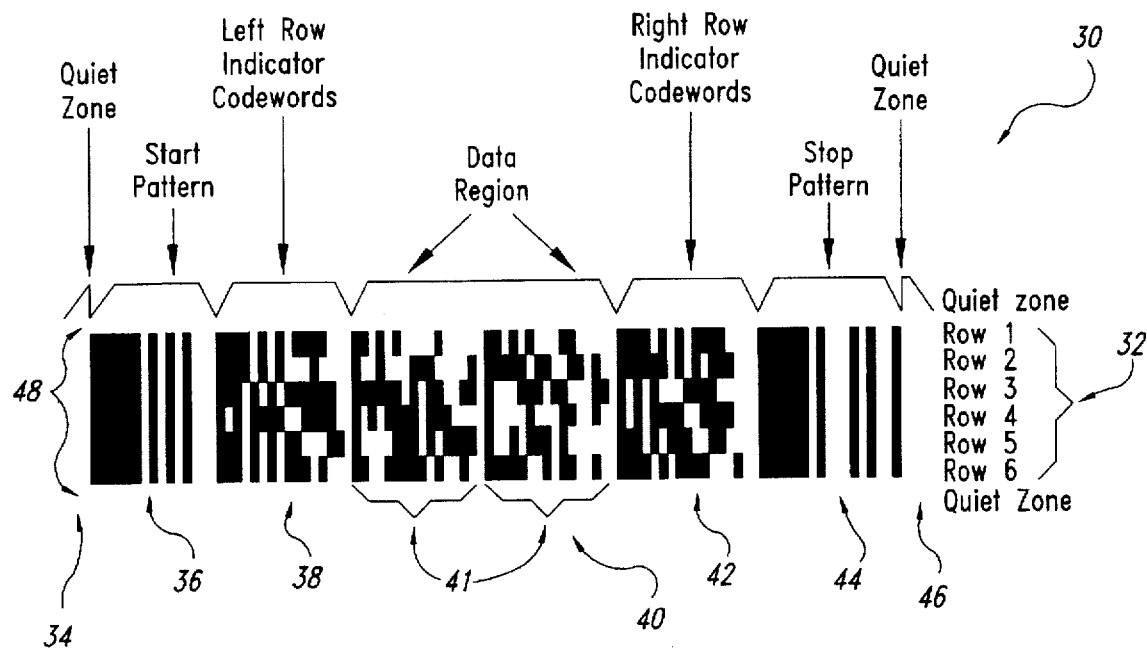
FIG. 1 shows a typical machine-readable symbol according to the prior art.
Figure 3:
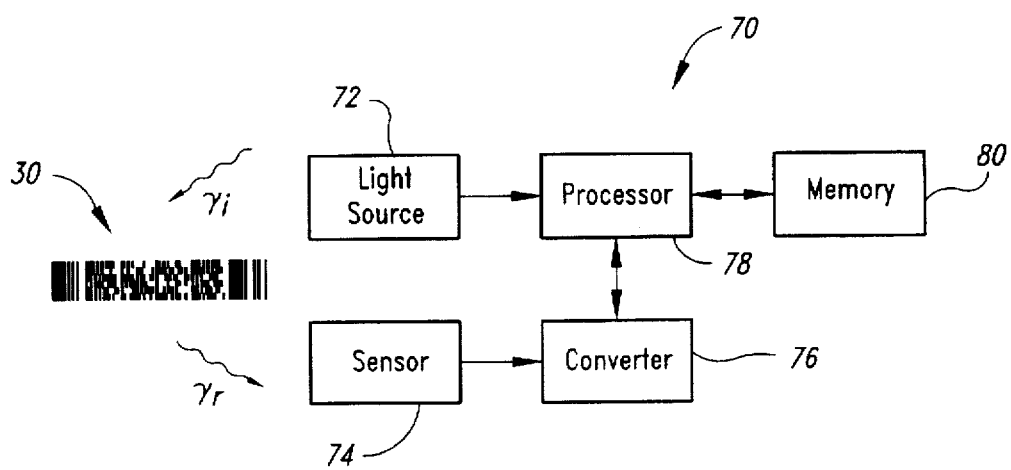
FIG. 3 is a block diagram depicting a symbology reader according to the present invention.
Figure 2:
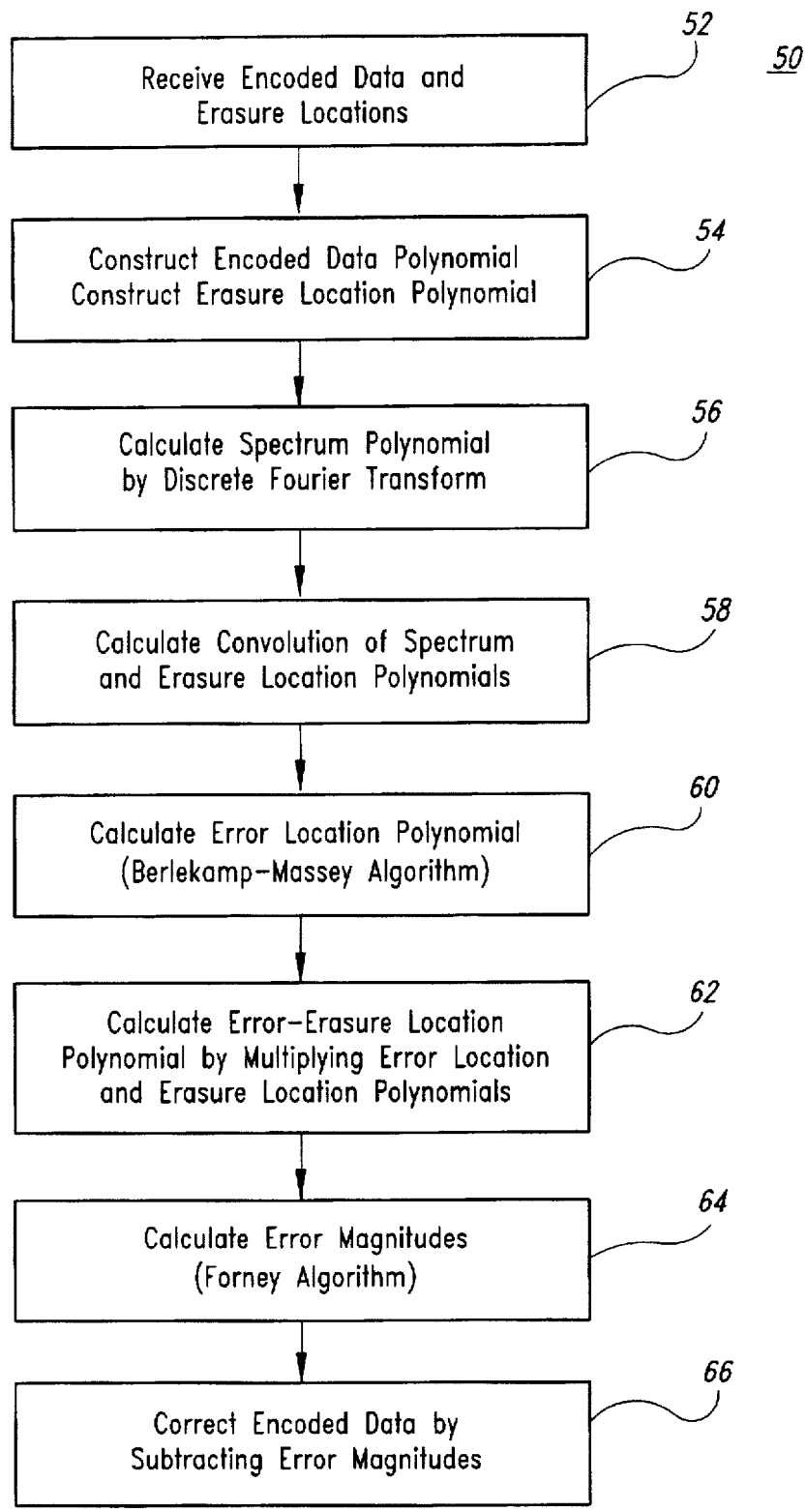
FIG. 2 is a flowchart depicting a method of error correction according to the prior art.

FIG. 3 depicts a symbology reader 70 according to the present invention. The reader 70 includes a light source 72 which illuminates a machine-readable symbol such as the PDF417 symbol 30 described above. A sensor 74 receives the light reflected from the symbol 30 and converts the received light into an electrical signal. The light source 72 can, for example, be a rasterizing laser while the sensor 74, in turn, can be a photodetector. Alternatively, the light source 72 can be an LED, flash bulb, infrared light source, or other light-emitting element, while the sensor 74 can be a charge-coupled device, semiconductor array, vidicon, or other imager capable of converting received light into electrical signals. In other instances, the light source 72 can be omitted and a sensor 74 employed which detects variations in reflection of ambient light.

A converter 76 receives the electrical signal from the sensor 74 and converts it into a signal to be processed by a programmed computer or processor 78. Typically the sensor 74 produces an analog signal that represents the modulated light reflected from the elements in the symbol 30, and the converter 76 then converts the analog signal to a digital signal which numerically represents the various amplitudes of the analog signal. A memory 80 is coupled to the processor 78 for storing a digital profile representing the amplitudes of the analog signal. Additionally, the memory 80 stores data and software programs for manipulation and execution, respectively, by the processor 78. The memory 80 also provides locations for storing various results of program execution.

Figure 4:
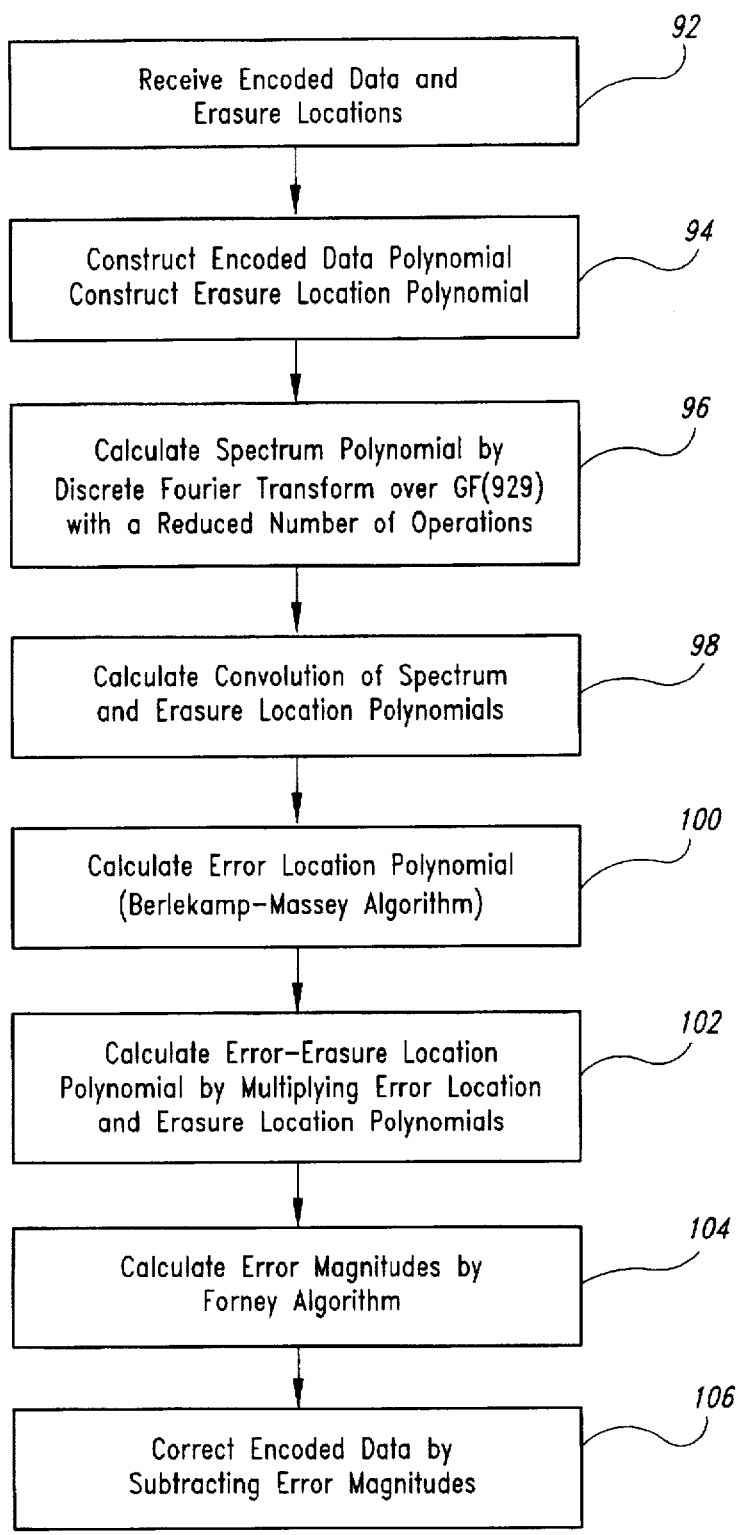
FIG. 4 is a flowchart depicting a method of error correction according to the present invention.

FIG. 4 is a flowchart which depicts an error correction routine 90 performed by the processor 78 according to the present invention. In step 92, the processor 78 receives encoded data from the converter 76, along with erasure locations, and stores the encoded data in the memory 80. In step 94, the processor 78 constructs an erasure location polynomial and an encoded data polynomial, by conventional methods, and stores the polynomials in the memory 80 for use in subsequent steps. In step 96, the processor 78 generates a data spectrum polynomial by performing a Fourier transform over Galois field GF(929) of the encoded data polynomial. As described in detail below, the Fourier transform employed uses a reduced number of operations relative to the prior art, and preferably accesses a look-up table for increased processing speed. The processor 78 performs a convolution of the data spectrum polynomial and erasure location polynomial in step 98. In step 100, the processor 78 calculates an error location polynomial, preferably under the conventional Berlekamp-Massey algorithm. The processor 78 then calculates an error-erasure location polynomial by multiplying the error location polynomial with the erasure location polynomial in step 102. The processor 78 then calculates error magnitudes in step 104, preferably according to the well-known Forney algorithm. Finally, in step 106, the processor 78 calculates corrected data by subtracting the previously calculated error magnitudes from the encoded data.

The error correction routine 90 of the present invention employs a discrete Fourier transform over the Galois field GF(929) with a reduced number of operations relative to prior art methods for error correcting PDF417 symbols. A data signal s comprises individual signal values $s_i$, each of which is a corresponding one of the encoded data values represented by the symbol characters 41 in the data region 40 of the symbol 30, or zero in the case of fewer than 928 encoded data values. The data signal s can be transformed into its spectrum p over GF(929) according to the equation $$p_j = \sum_{i=0}^{927} 3^{ij} s_i, \quad (1)$$

for j=0, 1, 2 , . . . . , 927, and where the number 3 is chosen as a prime number in GF(929). The index value i of signal values $s_i$ is known as a transform input index, and the index value j of spectral coefficients $p_j$ is called a transform output index. Calculation of spectral coefficients $p_j$ according to the equation (1) requires approximately 928*928 multiplications and 928*928 additions, or more than $1.72\times10^6$ arithmetic operations. If the symbology reader 70 must perform this many operations for each symbol it reads, the associated time lag between each symbol read will likely be unacceptable to the user. Alternatively, a high speed processor 78 must be used, which would necessarily increase the cost of reader 70.

There exist methods of performing a one-dimensional discrete Fourier transform as an equivalent two- or more dimensional discrete Fourier transform, in order to decrease the number of arithmetic operations required. The Good-Thomas FFT is one such method and is described in numerous texts. See, for example, *Theory and Practice of Error Control Codes*, by Richard E. Blahut (Addison Wesley, 1983), at pages 320–23. The Good-Thomas FFT exploits properties of a Galois field GF(n), where n is a prime number, by finding relatively prime factors $n_1$ and $n_2$ of n-1. A two-dimensional transform input index set $(i_1, i_2)$ is selected according to $$i_1 = i(modulo\ n_1)\ \text{and}\ i_2 = i(modulo\ n_2), \quad (2)$$

and a two-dimensional transform output index set $(j_1, j_2)$ according to $$j_1 = N_2 j(modulo\ n_1)\ \text{and}\ j_2 = N_1 j(modulo\ n_2), \quad (3)$$

where $N_1 n_1 + N_2 n_2 = 1$ (modulo n).

The transform input index is then recovered according to $$= N_1 n_1 i_2 + N_2 n_2 i_1\ (modulo\ n), \quad (4)$$

and the transform output index according to $$j = n_2 j_1 + n_1 j_2\ (modulo\ n). \quad (5)$$

A Good-Thomas FFT can be made particularly effective at reducing the number of required arithmetic operations if the matrix can be made as "square" as possible—i.e., minimize the absolute difference of $n_1$ and $n_2$. In the context of performing the Fourier transform 90 according to the present invention, $n_1=29$ and $n_2=32$, and the signal s and its spectrum p can then be related according to the equation $$p_j = p_{32j_1+29j_2} = \sum_{i_1=0}^{28} 3^{32j_1 i_1} \sum_{i_2=0}^{31} 3^{29j_2 i_2} s_{609 i_2 + 320 i_1}, \quad (6)$$

where $j=32j_1+29j_2$ (modulo 928) and $i=609i_2+320i_1$, (modulo 928). This version of the Fourier transform requires approximately 928*(29+32) multiplications and a similar number of additions, or less than $6\times10^4$ arithmetic operations.

Additional advantage may be taken of the PDF417 symbol structure. Although the PDF417 symbology provides up to 928 symbol characters in the data region 40 of the symbol 30, many times the symbol includes fewer symbol characters in the data region. Thus, the value of $s_{609 i_2 + 320 i_1}$ equals zero whenever $i=609i_2+320i_1$ (modulo 928) exceeds the number of the symbol characters 41 contained within the data region 40. The present invention further improves on the Good-Thomas FFT by constructing a table identifying which of the elements $s_{609 i_2 + 320 i_1}$ are non-zero whenever the number of the symbol characters 41 in the data region 40 is less than 928. In this way, the total number of arithmetic operations necessary to calculate the spectral coefficients $p_j$ can be significantly decreased.

Figure 5:
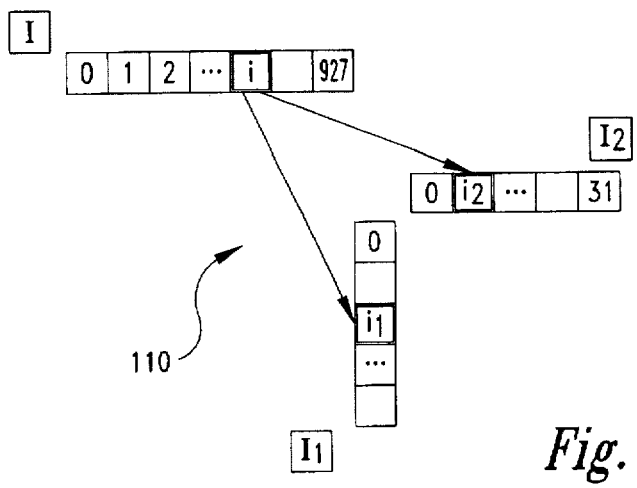
FIG. 5 is a graphical representation of a mapping function employed in the method of error correction of FIG. 4.

FIG. 5 depicts a function 110 which maps a one-dimensional array I={0,1, . . . , 928} into a two-dimensional array $(I_1, I_2)$={0,1, . . . ,28}×{0,1, . . . ,31}. The finction 110 is in fact the inverse finction ofthe identity $i=609i_2+320i_1$, (modulo 928), described above. The function 110 is single-valued, and allows us to rewrite the two-dimensional Fourier transform as $$p_j = p_{32j_1+29j_2} = \sum_{i_1=0}^{28} 3^{32j_1 i_1} \sum_{i_2=0}^{31} 3^{29j_2 i_2} s_{609 i_2 + 320 i_1}, \quad (7)$$

where I($i_1$,b) is a subset of {0,1, . . . , 31}. The members of each subset I($i_1$,b) depend on the particular value of $i_1$ and a value b. The value b is the number of symbol characters representing encoded data in the data region 40 of the PDF417 symbol 30, and is extracted from the information provided in the row indicators 38, 42 of the symbol. Each subset I($i_1$, b) identifies those values of index variable $i_2$ for which $S_{609 i_2 + 320 i_1}$ is non-zero. These values are given by the first k elements in a sequence defined by $$i_1+29^*r\ (modulo\ 32), \quad (8)$$

wit sequence index r=0,1, . . . , 31. The value k is the minimum one of values 31 and [b/29]+1, where [b/29] represents the greatest integer less than or equal to the ratio b/29.

For example, if the number of encoded data symbol characters in the data region 40 of the symbol 30 is b=148, then each subset I($i_1$, b)=I($i_1$, 148) includes the first k=min (31,[148/29]+1)=6 elements of the corresponding sequence $i_1+29^*r$ (modulo 32). As an example for a particular index value $i_1$=23, the subset I($i_1$,b)=I(23, 148) includes the first k=6 elements of the sequence 23+29*r (modulo 32), or I(23, 148)={23, 20, 17, 14, 11, 8}. The number of arithmetic computations now required to compute the Fourier transform is approximately 928*(29+6) multiplications, and a similar number of additions, or less than $1\times10^4$ arithmetic operations. This represents a considerable reduction of the required arithmetic computations for the Good-Thomas FFT.

Figure 6:
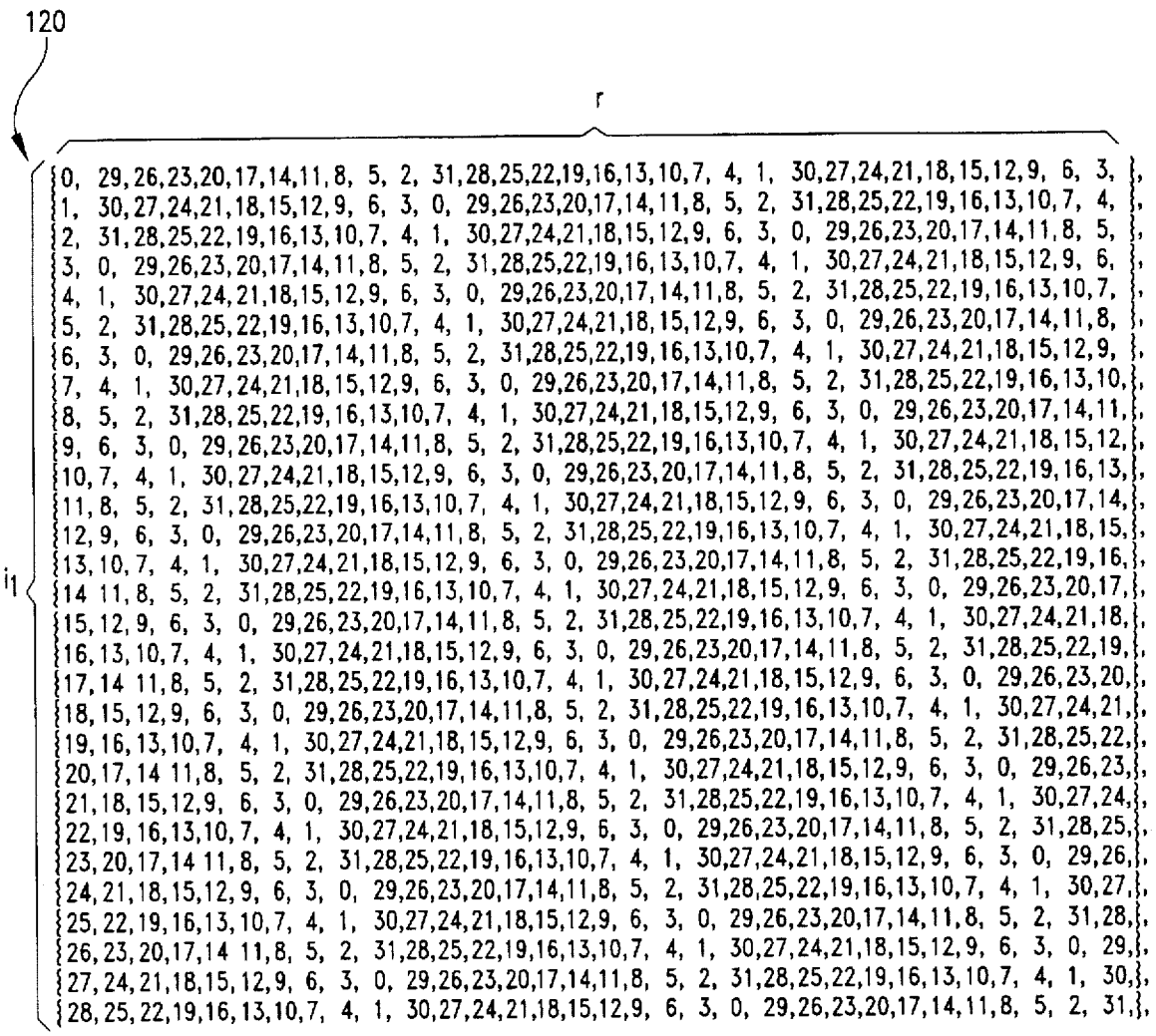
FIG. 6 shows a table of values used in the method of error correction of FIG. 4.

To avoid having the processor 78 spend time calculating the sequences given by equation (8), each of these sequences can be provided as part of a look-up table stored in the memory 80, rather than computing the sequence values each time a Fourier transform is performed. Such a look-up table is shown in FIG. 6 as table 120. Table 120 is organized into 29 rows by 32 columns. The rows are numbered 0 through 28, corresponding to the index value $i_1$, and the columns are numbered 0 through 31, corresponding to the sequence index r.

Figure 7:
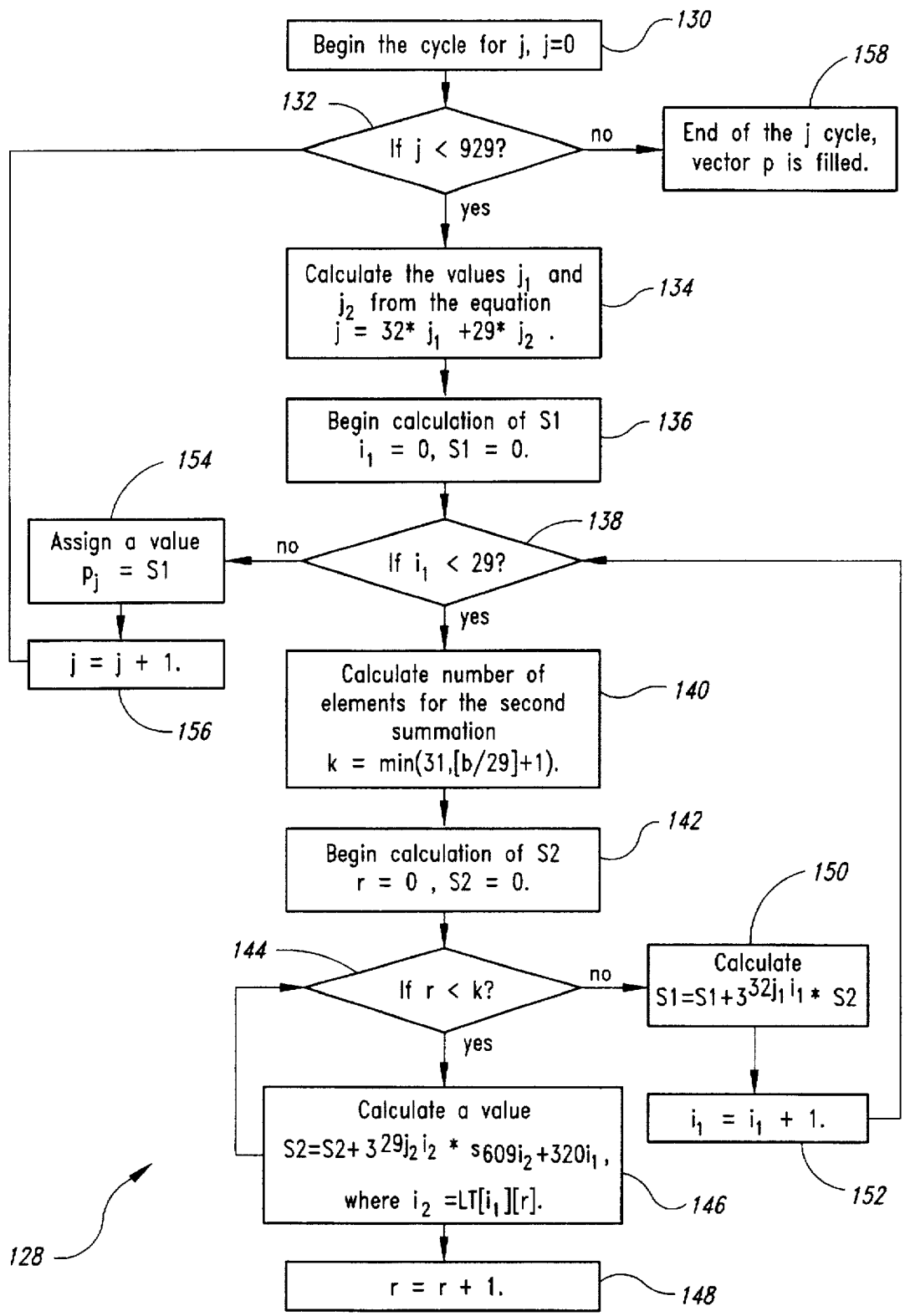
FIG. 7 is a flowchart depicting a method of calculating a Fourier transform with a reduced number of operations in the method of FIG. 4.

FIG. 7 shows a subroutine 128 employed by the processor 78 to perform the step 96 of FIG. 4. The subroutine begins in step 130, where the processor 78 sets the index value j to zero. Step 132 is a conditional branch step having the test j<929. If the condition of step 132 is satisfied, the processor 78 calculates the index values $j_1$ and $j_2$ from the equation $j=32j_1+29j_2$ (modulo 928), in step 134. In step 136, the processor 78 begins a cycle for calculating a first summation value S1 by setting the index value $i_1=0$ and the summation value S1=0. Step 138 is a conditional branch step having the test $i_1<29$. If the condition is satisfied, the processor 78 calculates the number k=min(31,[b/29]+1) in step 140. In step 142, the processor 78 begins a cycle for a second summation value S2 by setting the sequence index value r=0 and the summation value S2=0. Step 144 is a conditional branch step having the test r<k. If the condition is satisfied, the processor 78 increments the summation value S2 according to the equation $$S2=S2+329^{29j_2 r} * S_{609j_2+320ri}; \qquad (9)$$

where the value of $i_2$ is found in the $r^{th}$ column of the $i_1^{th}$ row of the table 120 shown in FIG. 6. In step 148, the processor 78 increments the value of r by 1 and the subroutine 128 loops back to step 144.

The processor 78 continues calculation of S2 according to steps 144, 146 and 148 until the condition of step 144 is no longer satisfied, whereupon the subroutine 128 branches to a step 150, where the processor 78 increments the first summation S1 according to the equation $$S1=S1+3^{32j_1 i_1} S_{pb} 2 \qquad (10)$$

Subsequently, the processor 78 increments the index value $i_1$ by 1 in step 152, and the subroutine 128 loops back to step 138. The processor 78 continues calculation of S1 according to steps 138, 140, 142, 144, 146, 148, 150 and 152 until the condition of step 138 is no longer satisfied, whereupon the subroutine 128 branches to a step 154, where the processor assigns a spectral value $p_j=S1$ corresponding to the value of index j. The processor 78 then increments the index j by 1 in step 156, the subroutine 128 loops back to step 132, and the processor begins to calculate the next spectral value. When the processor 78 completes calculation of all spectral values $P_j$, the condition of step 132 will no longer be satisfied, and the subroutine branches to step 158, terminating the Fourier transform calculation.

Although the present invention is described above with respect to PDF417 symbology, the present invention is equally applicable to other data collection symbologies in which error-correction spectral calculations are employed. Those skilled in the art will recognize that the above-described invention provides an apparatus and method for improved error correction calculation for all such symbologies. While specific embodiments of the present invention have been described for purposes of illustration, various equivalent modifications can be made without departing from the spirit and scope of the invention. For example, algebraically equivalent matrix inversions to the preferred Forney and Berlekamp-Massey algorithms may be used. Also, the reduction of operations taught by the present invention can be adapted to Fourier transform calculations other than the preferred Good-Thomas FFT. Therefore, the present invention is not limited by the disclosure but instead its scope is to be determined entirely by reference to the following claims.

I claim:

1. An apparatus for reading a machine-readable symbol having a data region with symbol characters, the symbol characters including information symbol characters and error correction symbol characters, the apparatus comprising:

a sensor receiving light reflected by the symbol and responsively producing an output signal;

a converter receiving the output signal and responsively producing a data signal indicative of at least some of the symbol characters; and a processor receiving the data signal and responsively producing an information signal indicative of the information symbol characters, the processor being programmed to perform an error correction routine including a discrete Fourier transform of the data signal, the Fourier transform having a first dimension characterized by a set of first index values and a second dimension characterized by a set of second index values, the Fourier transform being performed over a subset of the second index values, the subset being determined as a function of a given first index value and the number of symbol characters.

2. The apparatus of claim 1 wherein the subset of the second index values consists of specified ones of a sequence of values, the sequence being a function of a given first index value and the specified ones of the sequence being a function of the number of symbol characters.

3. The apparatus of claim 1 wherein the number of symbol characters cannot exceed 928 and the Fourier transform is performed over the Galois field GF(929), and wherein the subset of the second index values consists of specified ones of a sequence of values, the sequence being given by the relation $i_1+29*r$ counting modulo 32, with $i_1$ representing the first index value and r representing a sequence index ranging from integers 0 to 31 inclusive, and where the specified ones of the sequence are a first k members of the sequence, k being a minimum one of values 31 and [b/29]+1, with [b/29] representing the greatest integer less than or equal to a ratio b/29, where b is the number of symbol characters.

4. The apparatus of claim 1 wherein the function of a given first index value and the number of symbol characters is provided as a table of values accessible by the processor.

5. The apparatus of claim 1 wherein the number of symbol characters cannot exceed 928 and the Fourier transform is performed over the Galois field GF(929).

6. The apparatus of claim 1 wherein the number of symbol characters cannot exceed 928, the set of first index values is the set of all integers from 0 to 28 inclusive, the set of second index values is the set of all integers from 0 to 31 inclusive, and the subset of second index values is obtained from a table arranged in 29 rows and 32 columns, the subset of second index values listed at particular column locations in a row corresponding to the given first index value, the particular column locations corresponding to the number of symbol characters.

7. The apparatus of claim 6 wherein the table is algebraically equivalent to

| 0 | 29 | 26 | 23 | 20 | 17 | 14 | 11 | 8 | 5 | 2 | 31 | 28 | 25 | 22 | 19 | 16 | 13 | 10 | 7 | 4 | 1 | 30 | 27 | 24 | 21 | 18 | 15 | 12 | 9 | 6 | 3 |
|---|---|---|---|---|---|---|---|---|---|---|---|---|---|---|---|---|---|---|---|---|---|---|---|---|---|---|---|---|---|---|---|
| 1 | 30 | 27 | 24 | 21 | 18 | 15 | 12 | 9 | 6 | 3 | 0 | 29 | 26 | 23 | 20 | 17 | 14 | 11 | 8 | 5 | 2 | 31 | 28 | 25 | 22 | 19 | 16 | 13 | 10 | 7 | 4 |
| 2 | 31 | 28 | 25 | 22 | 19 | 16 | 13 | 10 | 7 | 4 | 1 | 30 | 27 | 24 | 21 | 18 | 15 | 12 | 9 | 6 | 3 | 0 | 29 | 26 | 23 | 20 | 17 | 14 | 11 | 8 | 5 |
| 3 | 0 | 29 | 26 | 23 | 20 | 17 | 14 | 11 | 8 | 5 | 2 | 31 | 28 | 25 | 22 | 19 | 16 | 13 | 10 | 7 | 4 | 1 | 30 | 27 | 24 | 21 | 18 | 15 | 12 | 9 | 6 |
| 4 | 1 | 30 | 27 | 24 | 21 | 18 | 15 | 12 | 9 | 6 | 3 | 0 | 29 | 26 | 23 | 20 | 17 | 14 | 11 | 8 | 5 | 2 | 31 | 28 | 25 | 22 | 19 | 16 | 13 | 10 | 7 |
| 5 | 2 | 31 | 28 | 25 | 22 | 19 | 16 | 13 | 10 | 7 | 4 | 1 | 30 | 27 | 24 | 21 | 18 | 15 | 12 | 9 | 6 | 3 | 0 | 29 | 26 | 23 | 20 | 17 | 14 | 11 | 8 |
| 6 | 3 | 0 | 29 | 26 | 23 | 20 | 17 | 14 | 11 | 8 | 5 | 2 | 31 | 28 | 25 | 22 | 19 | 16 | 13 | 10 | 7 | 4 | 1 | 30 | 27 | 24 | 21 | 18 | 15 | 12 | 9 |
| 7 | 4 | 1 | 30 | 27 | 24 | 21 | 18 | 15 | 12 | 9 | 6 | 3 | 0 | 29 | 26 | 23 | 20 | 17 | 14 | 11 | 8 | 5 | 2 | 31 | 28 | 25 | 22 | 19 | 16 | 13 | 10 |

-continued

| | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|
| 8 | 5 | 2 | 31 | 28 | 25 | 22 | 19 | 16 | 13 | 10 | 7 | 4 | 1 | 30 | 27 | 24 | 21 | 18 | 15 | 12 | 9 | 6 | 3 | 0 | 29 | 26 | 23 | 20 | 17 | 14 | 11 |
| 9 | 6 | 3 | 0 | 29 | 26 | 23 | 20 | 17 | 14 | 11 | 8 | 5 | 2 | 31 | 28 | 25 | 22 | 19 | 16 | 13 | 10 | 7 | 4 | 1 | 30 | 27 | 24 | 21 | 18 | 15 | 12 |
| 10 | 7 | 4 | 1 | 30 | 27 | 24 | 21 | 18 | 15 | 12 | 9 | 6 | 3 | 0 | 29 | 26 | 23 | 20 | 17 | 14 | 11 | 8 | 5 | 2 | 31 | 28 | 25 | 22 | 19 | 16 | 13 |
| 11 | 8 | 5 | 2 | 31 | 28 | 25 | 22 | 19 | 16 | 13 | 10 | 7 | 4 | 1 | 30 | 27 | 24 | 21 | 18 | 15 | 12 | 9 | 6 | 3 | 0 | 29 | 26 | 23 | 20 | 17 | 14 |
| 12 | 9 | 6 | 3 | 0 | 29 | 26 | 23 | 20 | 17 | 14 | 11 | 8 | 5 | 2 | 31 | 28 | 25 | 22 | 19 | 16 | 13 | 10 | 7 | 4 | 1 | 30 | 27 | 24 | 21 | 18 | 15 |
| 13 | 10 | 7 | 4 | 1 | 30 | 27 | 24 | 21 | 18 | 15 | 12 | 9 | 6 | 3 | 0 | 29 | 26 | 23 | 20 | 17 | 14 | 11 | 8 | 5 | 2 | 31 | 28 | 25 | 22 | 19 | 16 |
| 14 | 11 | 8 | 5 | 2 | 31 | 28 | 25 | 22 | 19 | 16 | 13 | 10 | 7 | 4 | 1 | 30 | 27 | 24 | 21 | 18 | 15 | 12 | 9 | 6 | 3 | 0 | 29 | 26 | 23 | 20 | 17 |
| 15 | 12 | 9 | 6 | 3 | 0 | 29 | 26 | 23 | 20 | 17 | 14 | 11 | 8 | 5 | 2 | 31 | 28 | 25 | 22 | 19 | 16 | 13 | 10 | 7 | 4 | 1 | 30 | 27 | 24 | 21 | 18 |
| 16 | 13 | 10 | 7 | 4 | 1 | 30 | 27 | 24 | 21 | 18 | 15 | 12 | 9 | 6 | 3 | 0 | 29 | 26 | 23 | 20 | 17 | 14 | 11 | 8 | 5 | 2 | 31 | 28 | 25 | 22 | 19 |
| 17 | 14 | 11 | 8 | 5 | 2 | 31 | 28 | 25 | 22 | 19 | 16 | 13 | 10 | 7 | 4 | 1 | 30 | 27 | 24 | 21 | 18 | 15 | 12 | 9 | 6 | 3 | 0 | 29 | 26 | 23 | 20 |
| 18 | 15 | 12 | 9 | 6 | 3 | 0 | 29 | 26 | 23 | 20 | 17 | 14 | 11 | 8 | 5 | 2 | 31 | 28 | 25 | 22 | 19 | 16 | 13 | 10 | 7 | 4 | 1 | 30 | 27 | 24 | 21 |
| 19 | 16 | 13 | 10 | 7 | 4 | 1 | 30 | 27 | 24 | 21 | 18 | 15 | 12 | 9 | 6 | 3 | 0 | 29 | 26 | 23 | 20 | 17 | 14 | 11 | 8 | 5 | 2 | 31 | 28 | 25 | 22 |
| 20 | 17 | 14 | 11 | 8 | 5 | 2 | 31 | 28 | 25 | 22 | 19 | 16 | 13 | 10 | 7 | 4 | 1 | 30 | 27 | 24 | 21 | 18 | 15 | 12 | 9 | 6 | 3 | 0 | 29 | 26 | 23 |
| 21 | 18 | 15 | 12 | 9 | 6 | 3 | 0 | 29 | 26 | 23 | 20 | 17 | 14 | 11 | 8 | 5 | 2 | 31 | 28 | 25 | 22 | 19 | 16 | 13 | 10 | 7 | 4 | 1 | 30 | 27 | 24 |
| 22 | 19 | 16 | 13 | 10 | 7 | 4 | 1 | 30 | 27 | 24 | 21 | 18 | 15 | 12 | 9 | 6 | 3 | 0 | 29 | 26 | 23 | 20 | 17 | 14 | 11 | 8 | 5 | 2 | 31 | 28 | 25 |
| 23 | 20 | 17 | 14 | 11 | 8 | 5 | 2 | 31 | 28 | 25 | 22 | 19 | 16 | 13 | 10 | 7 | 4 | 1 | 30 | 27 | 24 | 21 | 18 | 15 | 12 | 9 | 6 | 3 | 0 | 29 | 26 |
| 24 | 21 | 18 | 15 | 12 | 9 | 6 | 3 | 0 | 29 | 26 | 23 | 20 | 17 | 14 | 11 | 8 | 5 | 2 | 31 | 28 | 25 | 22 | 19 | 16 | 13 | 10 | 7 | 4 | 1 | 30 | 27 |
| 25 | 22 | 19 | 16 | 13 | 10 | 7 | 4 | 1 | 30 | 27 | 24 | 21 | 18 | 15 | 12 | 9 | 6 | 3 | 0 | 29 | 26 | 23 | 20 | 17 | 14 | 11 | 8 | 5 | 2 | 31 | 28 |
| 26 | 23 | 20 | 17 | 14 | 11 | 8 | 5 | 2 | 31 | 28 | 25 | 22 | 19 | 16 | 13 | 10 | 7 | 4 | 1 | 30 | 27 | 24 | 21 | 18 | 15 | 12 | 9 | 6 | 3 | 0 | 29 |
| 27 | 24 | 21 | 18 | 15 | 12 | 9 | 6 | 3 | 0 | 29 | 26 | 23 | 20 | 17 | 14 | 11 | 8 | 5 | 2 | 31 | 28 | 25 | 22 | 19 | 16 | 13 | 10 | 7 | 4 | 1 | 30 |
| 28 | 25 | 22 | 19 | 16 | 13 | 10 | 7 | 4 | 1 | 30 | 27 | 24 | 21 | 18 | 15 | 12 | 9 | 6 | 3 | 0 | 29 | 26 | 23 | 20 | 17 | 14 | 11 | 8 | 5 | 2 | 31. |

8. An apparatus for reading a machine-readable symbol having a data region with symbol characters, the symbol characters including information symbol characters and error correction symbol characters, the apparatus comprising:
  a sensor receiving light reflected by the symbol and responsively producing an output signal;
  a converter receiving the output signal and responsively producing an encoded data signal indicative of the symbol characters; and
  a processor receiving the encoded data signal and being programmed to perform an error correction routine including the steps of: (i) calculating a spectrum polynomial by discrete Fourier transform of the encoded data signal, the Fourier transform having a first dimension characterized by a set of first index values and a second dimension characterized by a set of second index values, the Fourier transform being performed over a subset of the second index values, the subset being determined as a function of a given first index value and the number of symbol characters; (ii) calculating a convolution of the spectrum polynomial with an erasure location polynomial constructed from the encoded data signal; (iii) calculating a first matrix inversion to obtain an error location polynomial; (iv) combining the error location polynomial and erasure location polynomials; (v) calculating a second matrix inversion to obtain a plurality of error magnitudes; and (vi) combining the error magnitudes with the encoded data signal to produce an information signal indicative of the information symbol characters.

9. The apparatus of claim 8 wherein the first matrix inversion is performed in accordance with the Berlekamp-Massey algorithm.

10. The apparatus of claim 8 wherein the second matrix inversion is performed in accordance with the Forney algorithm.

11. A method for reading a machine-readable symbol having a data region with symbol characters, the symbol characters including information symbol characters and error correction symbol characters, the method comprising the steps of:
  receiving light reflected by the symbol;
  producing a data signal indicative of at least some of the symbol characters;
  performing an error correction routine including a discrete Fourier transform of the data signal, the transform having a first dimension characterized by a set of first index values and a second dimension characterized by a set of second index values, the Fourier transform being performed over a subset of the second index values, the subset being determined as a function of a given first index value and the number of symbol characters; and
  producing an information signal indicative of information encoded in the information symbol characters.

12. The method of claim 11 wherein the subset of the second index values consists of specified ones of a sequence of values, the sequence being a function of a given first index value and the specified ones of the sequence being a function of the number of symbol characters.

13. The method of claim 11 wherein the number of symbol characters cannot exceed 928 and the Fourier transform is performed over the Galois field GF(929), and wherein the subset of the second index values consists of specified ones of a sequence of values, the sequence being given by the relation $i_1+29*r$ counting modulo 32, with $i_1$ representing the first index value and r representing a sequence index ranging from integers 0 to 31 inclusive, and where the specified ones of the sequence are a first k members of the sequence, k being a minimum one of values 31 and [b/29]+1, with [b/29] representing the greatest integer less than or equal to a ratio b/29, where b is the number of symbol characters.

14. The method of claim 11 wherein the function of a given first index value and the number of symbol characters is provided as a table of values.

15. The method of claim 11 wherein the number of symbol characters cannot exceed 928 and the Fourier transform is performed over the Galois field GF(929).

16. The method of claim 11 wherein the number of symbol characters cannot exceed 928, the set of first index values is the set of all integers from 0 to 28 inclusive, the set of second index values is the set of all integers from 0 to 31 inclusive, and the subset of second index values is obtained from a table arranged in 29 rows and 32 columns, the subset of second index values listed at particular column locations in a row corresponding to the given first index value, the particular column locations corresponding to the number of symbol characters.

17. The method of claim 16 wherein the table is algebraically equivalent to

| 0 | 29 | 26 | 23 | 20 | 17 | 14 | 11 | 8 | 5 | 2 | 31 | 28 | 25 | 22 | 19 | 16 | 13 | 10 | 7 | 4 | 1 | 30 | 27 | 24 | 21 | 18 | 15 | 12 | 9 | 6 | 3 |
|---|---|---|---|---|---|---|---|---|---|---|---|---|---|---|---|---|---|---|---|---|---|---|---|---|---|---|---|---|---|---|---|
| 1 | 30 | 27 | 24 | 21 | 18 | 15 | 12 | 9 | 6 | 3 | 0 | 29 | 26 | 23 | 20 | 17 | 14 | 11 | 8 | 5 | 2 | 31 | 28 | 25 | 22 | 19 | 16 | 13 | 10 | 7 | 4 |
| 2 | 31 | 28 | 25 | 22 | 19 | 16 | 13 | 10 | 7 | 4 | 1 | 30 | 27 | 24 | 21 | 18 | 15 | 12 | 9 | 6 | 3 | 0 | 29 | 26 | 23 | 20 | 17 | 14 | 11 | 8 | 5 |
| 3 | 0 | 29 | 26 | 23 | 20 | 17 | 14 | 11 | 8 | 5 | 2 | 31 | 28 | 25 | 22 | 19 | 16 | 13 | 10 | 7 | 4 | 1 | 30 | 27 | 24 | 21 | 18 | 15 | 12 | 9 | 6 |
| 4 | 1 | 30 | 27 | 24 | 21 | 18 | 15 | 12 | 9 | 6 | 3 | 0 | 29 | 26 | 23 | 20 | 17 | 14 | 11 | 8 | 5 | 2 | 31 | 28 | 25 | 22 | 19 | 16 | 13 | 10 | 7 |
| 5 | 2 | 31 | 28 | 25 | 22 | 19 | 16 | 13 | 10 | 7 | 4 | 1 | 30 | 27 | 24 | 21 | 18 | 15 | 12 | 9 | 6 | 3 | 0 | 29 | 26 | 23 | 20 | 17 | 14 | 11 | 8 |
| 6 | 3 | 0 | 29 | 26 | 23 | 20 | 17 | 14 | 11 | 8 | 5 | 2 | 31 | 28 | 25 | 22 | 19 | 16 | 13 | 10 | 7 | 4 | 1 | 30 | 27 | 24 | 21 | 18 | 15 | 12 | 9 |
| 7 | 4 | 1 | 30 | 27 | 24 | 21 | 18 | 15 | 12 | 9 | 6 | 3 | 0 | 29 | 26 | 23 | 20 | 17 | 14 | 11 | 8 | 5 | 2 | 31 | 28 | 25 | 22 | 19 | 16 | 13 | 10 |
| 8 | 5 | 2 | 31 | 28 | 25 | 22 | 19 | 16 | 13 | 10 | 7 | 4 | 1 | 30 | 27 | 24 | 21 | 18 | 15 | 12 | 9 | 6 | 3 | 0 | 29 | 26 | 23 | 20 | 17 | 14 | 11 |
| 9 | 6 | 3 | 0 | 29 | 26 | 23 | 20 | 17 | 14 | 11 | 8 | 5 | 2 | 31 | 28 | 25 | 22 | 19 | 16 | 13 | 10 | 7 | 4 | 1 | 30 | 27 | 24 | 21 | 18 | 15 | 12 |
| 10 | 7 | 4 | 1 | 30 | 27 | 24 | 21 | 18 | 15 | 12 | 9 | 6 | 3 | 0 | 29 | 26 | 23 | 20 | 17 | 14 | 11 | 8 | 5 | 2 | 31 | 28 | 25 | 22 | 19 | 16 | 13 |
| 11 | 8 | 5 | 2 | 31 | 28 | 25 | 22 | 19 | 16 | 13 | 10 | 7 | 4 | 1 | 30 | 27 | 24 | 21 | 18 | 15 | 12 | 9 | 6 | 3 | 0 | 29 | 26 | 23 | 20 | 17 | 14 |
| 12 | 9 | 6 | 3 | 0 | 29 | 26 | 23 | 20 | 17 | 14 | 11 | 8 | 5 | 2 | 31 | 28 | 25 | 22 | 19 | 16 | 13 | 10 | 7 | 4 | 1 | 30 | 27 | 24 | 21 | 18 | 15 |
| 13 | 10 | 7 | 4 | 1 | 30 | 27 | 24 | 21 | 18 | 15 | 12 | 9 | 6 | 3 | 0 | 29 | 26 | 23 | 20 | 17 | 14 | 11 | 8 | 5 | 2 | 31 | 28 | 25 | 22 | 19 | 16 |
| 14 | 11 | 8 | 5 | 2 | 31 | 28 | 25 | 22 | 19 | 16 | 13 | 10 | 7 | 4 | 1 | 30 | 27 | 24 | 21 | 18 | 15 | 12 | 9 | 6 | 3 | 0 | 29 | 26 | 23 | 20 | 17 |
| 15 | 12 | 9 | 6 | 3 | 0 | 29 | 26 | 23 | 20 | 17 | 14 | 11 | 8 | 5 | 2 | 31 | 28 | 25 | 22 | 19 | 16 | 13 | 10 | 7 | 4 | 1 | 30 | 27 | 24 | 21 | 18 |
| 16 | 13 | 10 | 7 | 4 | 1 | 30 | 27 | 24 | 21 | 18 | 15 | 12 | 9 | 6 | 3 | 0 | 29 | 26 | 23 | 20 | 17 | 14 | 11 | 8 | 5 | 2 | 31 | 28 | 25 | 22 | 19 |
| 17 | 14 | 11 | 8 | 5 | 2 | 31 | 28 | 25 | 22 | 19 | 16 | 13 | 10 | 7 | 4 | 1 | 30 | 27 | 24 | 21 | 18 | 15 | 12 | 9 | 6 | 3 | 0 | 29 | 26 | 23 | 20 |
| 18 | 15 | 12 | 9 | 6 | 3 | 0 | 29 | 26 | 23 | 20 | 17 | 14 | 11 | 8 | 5 | 2 | 31 | 28 | 25 | 22 | 19 | 16 | 13 | 10 | 7 | 4 | 1 | 30 | 27 | 24 | 21 |
| 19 | 16 | 13 | 10 | 7 | 4 | 1 | 30 | 27 | 24 | 21 | 18 | 15 | 12 | 9 | 6 | 3 | 0 | 29 | 26 | 23 | 20 | 17 | 14 | 11 | 8 | 5 | 2 | 31 | 28 | 25 | 22 |
| 20 | 17 | 14 | 11 | 8 | 5 | 2 | 31 | 28 | 25 | 22 | 19 | 16 | 13 | 10 | 7 | 4 | 1 | 30 | 27 | 24 | 21 | 18 | 15 | 12 | 9 | 6 | 3 | 0 | 29 | 26 | 23 |
| 21 | 18 | 15 | 12 | 9 | 6 | 3 | 0 | 29 | 26 | 23 | 20 | 17 | 14 | 11 | 8 | 5 | 2 | 31 | 28 | 25 | 22 | 19 | 16 | 13 | 10 | 7 | 4 | 1 | 30 | 27 | 24 |
| 22 | 19 | 16 | 13 | 10 | 7 | 4 | 1 | 30 | 27 | 24 | 21 | 18 | 15 | 12 | 9 | 6 | 3 | 0 | 29 | 26 | 23 | 20 | 17 | 14 | 11 | 8 | 5 | 2 | 31 | 28 | 25 |
| 23 | 20 | 17 | 14 | 11 | 8 | 5 | 2 | 31 | 28 | 25 | 22 | 19 | 16 | 13 | 10 | 7 | 4 | 1 | 30 | 27 | 24 | 21 | 18 | 15 | 12 | 9 | 6 | 3 | 0 | 29 | 26 |
| 24 | 21 | 18 | 15 | 12 | 9 | 6 | 3 | 0 | 29 | 26 | 23 | 20 | 17 | 14 | 11 | 8 | 5 | 2 | 31 | 28 | 25 | 22 | 19 | 16 | 13 | 10 | 7 | 4 | 1 | 30 | 27 |
| 25 | 22 | 19 | 16 | 13 | 10 | 7 | 4 | 1 | 30 | 27 | 24 | 21 | 18 | 15 | 12 | 9 | 6 | 3 | 0 | 29 | 26 | 23 | 20 | 17 | 14 | 11 | 8 | 5 | 2 | 31 | 28 |
| 26 | 23 | 20 | 17 | 14 | 11 | 8 | 5 | 2 | 31 | 28 | 25 | 22 | 19 | 16 | 13 | 10 | 7 | 4 | 1 | 30 | 27 | 24 | 21 | 18 | 15 | 12 | 9 | 6 | 3 | 0 | 29 |
| 27 | 24 | 21 | 18 | 15 | 12 | 9 | 6 | 3 | 0 | 29 | 26 | 23 | 20 | 17 | 14 | 11 | 8 | 5 | 2 | 31 | 28 | 25 | 22 | 19 | 16 | 13 | 10 | 7 | 4 | 1 | 30 |
| 28 | 25 | 22 | 19 | 16 | 13 | 10 | 7 | 4 | 1 | 30 | 27 | 24 | 21 | 18 | 15 | 12 | 9 | 6 | 3 | 0 | 29 | 26 | 23 | 20 | 17 | 14 | 11 | 8 | 5 | 2 | 31. |

18. A method for reading a machine-readable symbol having a data region with symbol characters, the symbol characters including information symbol characters and error correction symbol characters, the method comprising the steps of:

receiving light reflected by the symbol;

producing an encoded data signal indicative of the symbol characters;

performing an error correction routine including: (i) calculating a spectrum polynomial by discrete Fourier transform of the encoded data signal, the Fourier transform having a first dimension characterized by a set of first index values and a second dimension characterized by a set of second index values, the Fourier transform being performed over a subset of the second index values, the subset being determined as a function of a given first index value and the number of symbol characters; (ii) calculating a convolution of the spectrum polynomial with an erasure location polynomial constructed from the encoded data signal; (iii) calculating a first matrix inversion to obtain an error location polynomial; (iv) combining the error location polynomial and erasure location polynomials; (v) calculating a second matrix inversion to obtain a plurality of error magnitudes; and (vi) combining the error magnitudes with the encoded data signal to produce an information signal indicative of the information symbol characters.

19. The method of claim 18 wherein the first matrix inversion is performed in accordance with the Berlekamp-Massey algorithm.

20. The method of claim 18 wherein the second matrix inversion is performed in accordance with the Forney algorithm.

21. A method for reading a machine-readable symbol having a data region with symbol characters, the symbol characters including information symbol characters and error correction symbol characters, the method comprising the steps of:

determining the maximum possible number of symbol characters in the data region of the symbol;

receiving light reflected by the symbol;

producing an encoded data signal indicative of the symbol characters; and performing an error correction routine including: (i) determining the actual number of symbol characters in the data region of the symbol; and (ii) determining the number of arithmetic computations required to calculate a plurality of spectral coefficients corresponding to the encoded data signal, the number of arithmetic computations being functionally related both to the maximnum number of symbol characters and the actual number of symbol characters.

\* \* \* \* \*